United States Patent [19]

Bucklen

[11] Patent Number: 4,591,825

[45] Date of Patent: May 27, 1986

[54] ANALOG-TO-DIGITAL-CONVERTER AND RELATED ENCODING TECHNIQUE

[75] Inventor: Willard K. Bucklen, San Diego, Calif.

[73] Assignee: TRW Inc., Redondo Beach, Calif.

[21] Appl. No.: 525,576

[22] Filed: Aug. 22, 1983

[51] Int. Cl.$^4$ .......................................... H03K 13/175
[52] U.S. Cl. ...................... 340/347 AD; 340/347 DD; 340/347 P
[58] Field of Search ................ 340/347 AD, 347 DD, 340/347 P; 307/360–361

[56] References Cited

U.S. PATENT DOCUMENTS

| | | | |
|---|---|---|---|
| 3,518,663 | 6/1970 | Oddo et al. | 340/347 P |
| 3,531,798 | 9/1970 | Dureau | 340/347 P |
| 3,560,959 | 2/1971 | Bergey | 340/347 DD |
| 3,877,025 | 4/1975 | Maio | 307/361 |
| 4,058,806 | 11/1977 | Madler | 340/347 AD |
| 4,576,543 | 6/1981 | Miller et al. | 340/347 AD |

*Primary Examiner*—Vit W. Miska
*Attorney, Agent, or Firm*—Noel F. Heal; Robert M. Wallace

[57] ABSTRACT

A parallel analog-to-digital converter employing a novel binary encoding technique to reduce the errors arising from multiple one-to-zero transitions in comparator outputs. An analog signal to be converted is applied in conventional fashion to any array of comparators, from which are obtained an array of output signals having a transition from ones to zeros at the array position corresponding to the analog signal magnitude. The one-to-zero transition is detected by conventional AND gate circuitry and the resulting one-in-$(2^n-1)$ code is transmitted to encoding logic configured to produce a novel form of binary output code. The code is identical to Gray code in all but its least significant bit position, which alternates between one and zero values in the manner of standard binary code. The new code results in a significant reduction in the magnitude of errors arising from multiple transitions between one and zero in the array of comparator outputs.

13 Claims, 5 Drawing Figures

ANALOG-TO-DIGITAL-CONVERTER AND RELATED ENCODING TECHNIQUE

BACKGROUND OF THE INVENTION

This invention relates generally to analog-to-digital converters, and more particularly, to encoding techniques employed to minimize errors arising in the conversion process. One of the most basic devices for the conversion of analog signals to digital form is the parallel analog-to-digital converter, in which an analog input signal is simultaneously compared with a large number of reference signals, representing each step in the range of the converter. For a converter having an n-bit digital output, there are $2^n - 1$ reference levels and a like number of comparator circuits. For example, in an eight-bit converter there are 255 comparators, and 255 reference levels corresponding to the incremental steps between zero and a full-scale input value.

When an input signal is applied to the comparators, those having as inputs reference levels less than the input signal will produce an output signal of the same binary state, for example a logical "one" output, while the remainder will have an output of the opposite state, for example a logical "zero." For this reason, the output code is sometimes referred to as a thermometer code. The desired digital output can be obtained as the sum of the individual comparator outputs. For example, if a half-scale input signal is applied to the conversion circuit, providing logical "one" outputs from 128 of the comparators, the desired digital output signal is then 128, or, in fractional form, is a digital quantity proportional to 128/256. Implementation of an adder to count the number of "one" comparator outputs is not a simple matter, however, and virtually all higher-resolution parallel analog-to-digital converters built today rely on the detection of a single one-to-zero transition in the array of comparator outputs. Once the transition is located, it is converted to a desired digital code in a read-only memory circuit.

A potential for error exists in this conversion approach, however, since two or more one-to-zero transitions may occur over the array of comparator outputs. Multiple transitions may be caused by any of a variety of factors, such as rapidily slewing input signals, or non-matching comparator characteristics. If a conventional approach is used to convert from a one-in-n transition code to a corresponding binary code, the application of two transition codes will result in an output code that is the logical OR of two codes, only one of which is correct. The difference between this composite output and the correct binary code equivalent to the input signal varies from zero to more than fifty percent of full-scale, depending on the specific codes and input signals.

A common solution to this problem is to employ a well known binary code known as Gray code, instead of standard binary code, when converting from the one-in-n code obtained in the detection of a transition. The inherent difficulty with standard binary code, and the advantages of Gray code, can be appreciated from a simple example. Suppose that two one-to-zero transitions are detected and that they are one bit position apart. In standard binary code, the two transitions might translate into codes of 00000010 and 00000011, for example, corresponding to decimal values of 2 and 3, respectively. The logical OR of these two codes is 00000011, which is either exactly equal to the correct result, or is one bit in error. Suppose, however, that the two transitions were instead equivalent to binary codes of 01111111 and 10000000, corresponding to decimal values of 127 and 128. When these codes are ORed together, the result is 11111111, or 255 decimal. The error is therefore 01111111 or 10000000, depending on which of the transitions is the correct one. The error expressed as a decimal number is 127 or 128, which is approximately one hundred percent of the correct value and fifty percent of the full-scale value.

In Gray code, each step or increment of the code results in a change of state at only one bit position. If two adjacent one-to-zero transitions were detected, i.e. with a bit separation of one, use of the Gray code would limit the error to one part in $2^n$. For example, the Gray-code forms of the decimal numbers 127 and 128 are 01000000 and 11000000, respectively. When these codes are ORed together, the result is 11000000. In general, then, the logical OR of two adjacent Gray codes is always equal to one of the two codes. Therefore, the error will be either zero, if the result of the ORing operation is the correct code, or will be one part in $2^n$, where n is the number of bit positions in the code. Use of the Gray code also provides protection, but to a lesser degree, when the detected transitions are separated by more than one bit position.

In the most commonly used scheme for transition detection, the comparator outputs are connected as inputs to an array of AND gates, in such a manner as to generate a logical "one" output only at the transition point. In this arrangement of AND gates, it is impossible to obtain an indication of two transitions separated only by one bit position. In other words, the error best protected against by the use of Gray code cannot occur in the most commonly used transition detection scheme. It is therefore important to examine the affect of Gray code on multiple transitions separated by more than one bit position.

It happens that the use of Gray code does not eliminate or minimize errors resulting from transitions separated by two or more bit positions, and there is therefore a significant need for a parallel analog-to-digital converter in which such errors are greatly reduced. The present invention fulfills this need.

SUMMARY OF THE INVENTION

The present invention resides in binary encoding means that significantly reduces errors resulting from multiple simultaneous inputs. Basically, the encoding means is operative to convert a one-in-$(2^n-1)$ input to an n-bit output that is the same as Gray code except in the least significant bit position. The value of the least significant bit alternates between one and zero, in the manner of a standard binary counter, as the code as stepped through its range corresponding to decimal values of one to n.

More specifically, the invention resides in a parallel analog-to-digital converter employing the encoding means. In general terms, the analog-to-digital converter of the invention, when configured to provide an n-bit output, includes $2^n-1$ comparators, an input circuit for connecting an analog input signal to one terminal of each of the comparators, a reference signal source, providing $2^n-1$ different reference signals for input to respective ones of the comparators, transition detection means, for indicating the transition between ones and zeros in the array of comparator outputs, and encoding means for converting a one-in-$(2^n-1)$ code from the transition detection means to an n-bit modified Gray code in which the least significant bit alternates between one and zero.

The modified Gray code is characterized by the property that, in its second-least-significant bit positions and higher bit positions, no more than one bit position changes value as the code progresses from one incremental level to the next. However, in the least significant bit position the value always alternates between zero and one as the code progresses from one level to the next. For certain separations between the correct and incorrect transitions, the modified code achieves a significant improvement over Gray code. The converter may also include means for translating from the modified Gray code to standard binary code before output from the converter.

It will be appreciated from the foregoing that the present invention represents a significant improvement over the use of Gray code and binary code for particular applications of encoding, such as parallel analog-to-digital conversion. The encoding means of the invention is particularly useful in the processing of ambiguous inputs spaced by two or more bit positions. Other aspects and advantages of the invention will become apparent from the following more detailed description, taken in conjunction with the accompanying drawings.

DESCRIPTION OF THE PREFERRED EMBODIMENT

Figure 1:
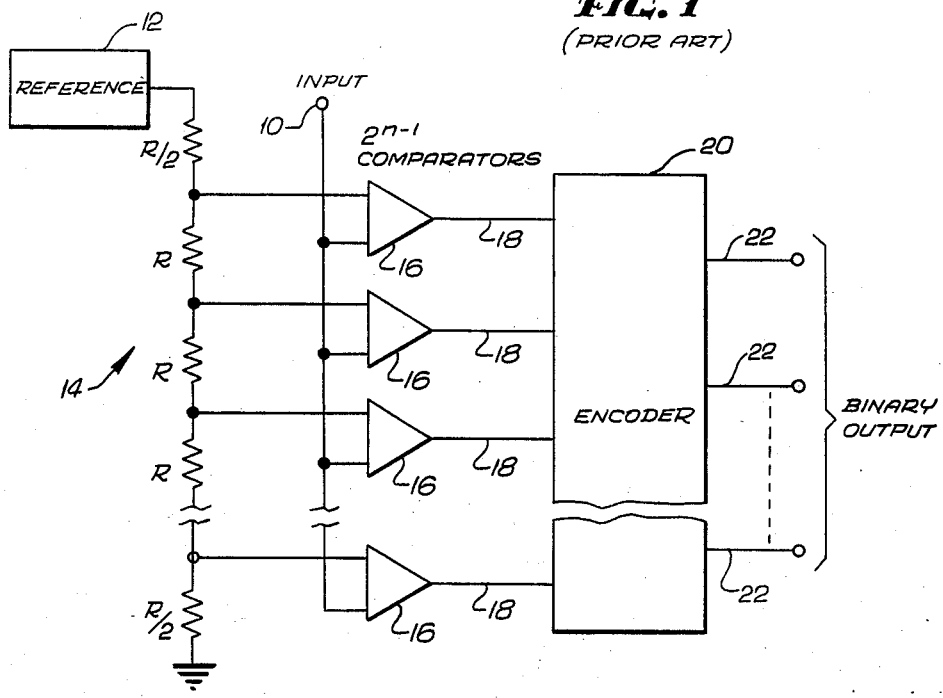
FIG. 1 is a simplified block diagram of a conventional parallel analog-to-digital converter.

As shown in the drawings for purposes of illustration, the present invention is principally concerned with improvements in parallel analog-to-digital converters. Parallel analog-to-digital conversion is performed by comparing an analog input signal, indicated by reference numeral 10 in FIG. 1, with each of a plurality of reference levels derived from a common voltage reference 12. The reference 12 is connected to a voltage divider 14 to provide a plurality of reference levels, one for each increment in a range from zero to full scale. For an n-bit converter, $2^n-1$ reference levels are obtained from the voltage divider 14 and applied as inputs to an equal number of comparators 16.

Each of the reference levels applied to the comparators 16 corresponds to a different step in the full range of the device. The reference levels are separated by increments of one nth of the full-scale input voltage that can be converted. One typical arrangement is that the lowest reference level is at the mid-point of the lowest step in the range. For example, in an eight-bit converter there are 256 steps in the measurable input voltage range. The lowest reference level can be set at ½n or 1/512 of the full reference voltage, and any input signal below this value is treated as zero. Likewise the highest reference level is 511/512 of the full reference voltage, and any input signal above this is considered to be at a full-scale level.

In the conversion process, $2^n-1$ comparisons are simultaneously made in the comparators 16, resulting in m comparator outputs of one binary state, such as "one," and $(2^n-1-m)$ comparator outputs of the opposite binary state. The comparator outputs, on lines 18, are applied to an encoder 20, which produces a corresponding n-bit binary output on lines 22. As will now be explained in more detail, the encoder 20 performs two distinct steps. The first is to detect the transition from ones to zeros in the array of comparator outputs, to yield a one-in-$(2^n-1)$ code, and the second is to convert this code into a binary code of some kind.

A significant source of error arises in parallel analog-to-digital conversion because rapidly slewing input signals or large comparator offsets can produce more than one transition between one and zero over the array of comparator outputs. As will be appreciated from the description that follows, these multiple transitions produce erroneous outputs from the encoder 20, and the magnitude of the error is potentially very large, depending in part on the type of binary encoding employed in the encoder 20.

Figure 2A:
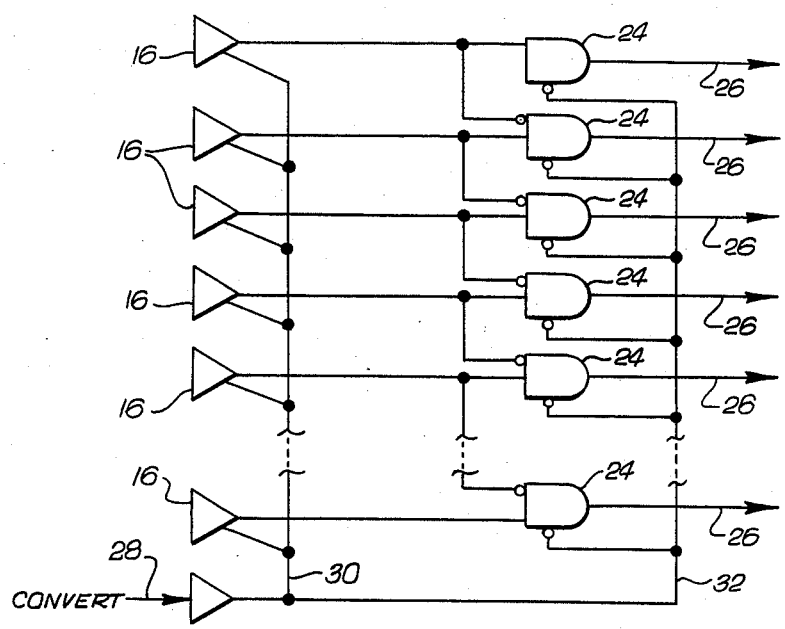
FIG. 2a is a simplified logic diagram showing the connection of comparators in the converter to a corresponding number of two-input AND gates for the detection of one-to-zero transitions in the array of comparator outputs.
Figure 2B:
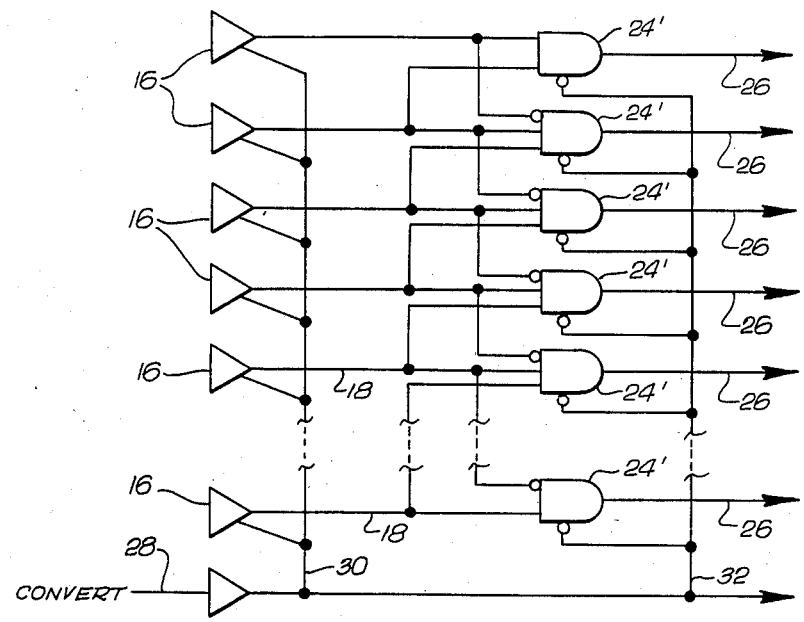
FIG. 2b is a logic diagram similar to FIG. 2a, but showing three-input AND gates for transition detection.

The detection of one-to-zero transitions in the array of comparator outputs is typically effected by means of $2^n-1$ AND gates 24, as shown in FIG. 2a or FIG. 2b. In FIG. 2a, each of the AND gates 24 in the array has two inputs, except the top one in the array, which has only one input. The AND gates 24 have outputs on lines 26. Each of the lines 18 from the comparators 16 is connected to one of the inputs to a corresponding AND gate. The other input to each AND gate is derived from the next highest level of comparator output and is inverted before application to the AND gate. If the AND gates 24 are considered to be numbered from the bottom (lowest voltage) position to the top, AND gate number i will have an output of $C_i \cdot \overline{C}_{i+1}$, where $C_i$ is the output from comparator i and the symbol "." represents a logical AND operation. It will be apparent that if two ones or two zeros are applied to one of the AND gates, a zero output will result. A "one" output will be obtained at position i only if the ith comparator output is a one and the (i+1)th comparator output is zero, i.e. at the transition between ones and zeros in the array of comparator outputs. The highest level AND gate has only one input, of course, so that if there is a "one" comparator output at that level the "transition" will be shown as occurring at the highest level, indicating a full-scale input signal.

Operation of the AND gate logic may be controlled by a "convert" signal, indicated at 28, which is applied to each of the comparators 16, over lines 30. The convert signal is also applied in inverted form, over lines 32, to enable operation of the AND gates 24.

The arrangement of FIG. 2b is similar to that of FIG. 2a except that each of the AND gates 24' has three inputs, except the uppermost and lowermost ones, which have two inputs each. As in the FIG. 2a configuration, the ith AND gate has one input derived from the ith comparator output and a second input derived from the inverse of the (i+1)th comparator output. The third input to each AND gate 24' is derived from the (i−1)th comparator output. In general, then the output of the ith AND gate is given by the expression $C_{i-1} \cdot C_i \cdot \overline{C}_{i+1}$, where $C_i$ represents the ith comparator output, as before.

In effect, the three-input AND gate arrangement of FIG. 2b requires a comparator output sequence of 1-1-0 in order to indicate a detected transition, whereas the two-input AND gate arrangement of FIG. 2a requires only a sequence of X-1-0, where the value of X is irrelevant. From a cost standpoint, which is always an important consideration in the production of converters in integrated-circuit form, the two-input AND gate transition detection scheme of FIG. 2a is to be preferred, especially when used in conjunction with the present invention.

Figure 3:
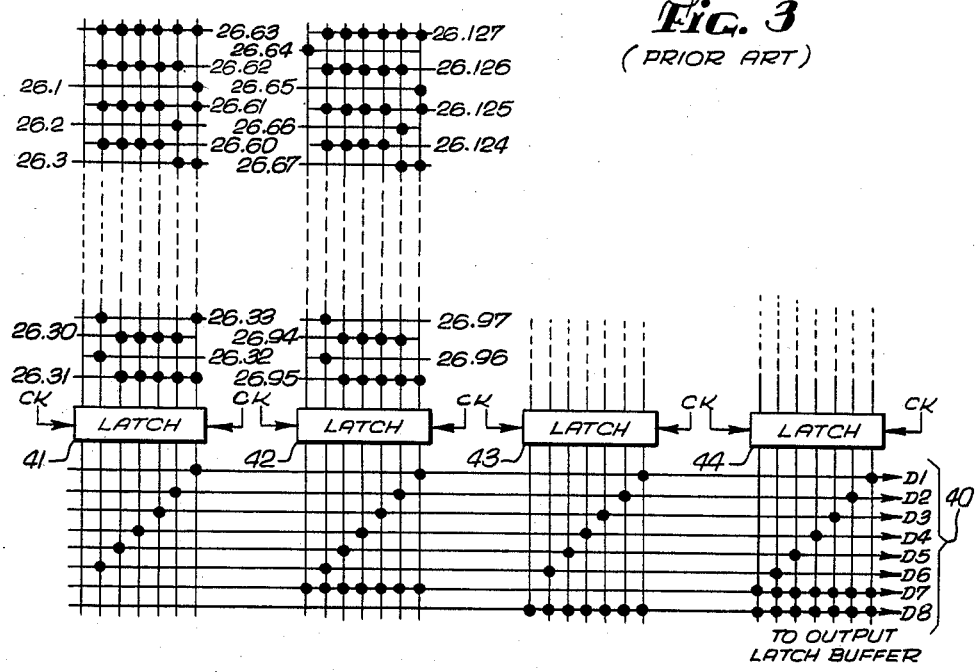
FIG. 3 is logic diagram of a binary encoding circuit for the conversion of a one-in-$(2^n-1)$ signal from the transition detection AND gates of FIG. 2a or FIG. 2b to standard binary code.

The AND gate outputs 26 should theoretically contain a single one-in-$(2^n-1)$ signal indicative of the correct transition from ones to zeros in the array of outputs from the comparators 16. FIG. 3 shows a conventional encoding technique for converting the transition signal on lines 26 to an eight-bit standard binary signal on output lines 40. The encoding logic of FIG. 3 includes four seven-bit latches 41–44, each of which has seven input lines and seven output lines. The first sixty-three of the AND gate outputs 26 are selectively connected to the seven inputs of latch 41. The AND gate outputs 26 are indicated by numerals 26.1, 26.2, and so forth. The solid dots on the intersections of the latch inputs and the AND gate output lines indicate logical OR connections, as do the dots on the intersections between the latch outputs and the eight binary output lines 40.

It will be seen that the intersections of the lines 26 and the inputs to the latch 41 are programmed to load the latch 41 with a binary code equivalent to the position of the AND gate from which the line 26 is derived. Thus a "one" on line 26.1 results in a binary code of 0000001 being loaded into latch 41, a "one" on line 26.2 results in a binary code of 0000010, and so forth. The outputs from the latch 41 are connected directly to the corresponding output lines 40. Accordingly, a "one" output on any of the lines 26.1 through 26.63 will result in a corresponding binary code 0000001 through 0111111 being latched into latch 41 and output on the binary output lines 40.

AND gate outputs 26.64 through 26.127 are selectively connected, in a similar manner, to the inputs of latch 42. Line 26.64 results in a latched code of 1000000, but lines 26.65 through 26.127 result in latched codes identical with those latched as a result of inputs on lines 26.1 through 26.63, respectively. That is, line 26.64 results in a latched code of 0000001 and so forth. On the output side of the latch 42, the six least significant bits of the latch are connected to the corresponding six bits of the output lines 40. In addition, an output on any of the seven output lines from latch 42 results in an output on the seventh bit postion of the output lines 40. Outputs on lines 26.64 through 26.127 therefore result in binary outputs of 01000000 through 01111111 on lines 40.

In a similar fashion, lines 26.128 through 26.191 are connected to the input lines of latch 43 and lines 26.192 through 26.255 are connected to the input lines of latch 44. The input connections for latches 43 and 44 are in fact identical with those of latch 42. On the output side of latch 43, however, a "one" output on any of the seven output positions results in an output at the eighth bit position of the output lines 40. Similarly, for latch 43 a "one" output on any of the seven output positions results in an output at the seventh and eighth position of the output lines 40. Thus the output code on lines 40 is a standard binary code in the range 00000001 through 11111111, corresponding to inputs on lines 26.1 through 26.255, respectively.

This rather detailed description of the prior art provides an appreciation of the principal disadvantage of standard binary coding in parallel analog-to-digital converters. It will seen from FIG. 3 that, if two or more "one" inputs are provided on lines 26, the resulting output code on lines 40 will be the logical OR of the two codes resulting from the separate application of the same input signals. For example, if both lines 26.1 and 26.2 are in the "one" state, a code of 00000011 will be output on lines 40, this being the logical OR of codes 00000001 and 00000010. In decimal terms, a result of "3" will be obtained from simultaneous inputs of "1" and "2", only one of which is correct. The result in this example may not be very disturbing, but consider what happens if simultaneous "one" inputs are provided on lines 26.127 and 26.128. The combined output on lines 40 is then 11111111, when the correct code should be either 10000000 or 01111111. The error is then approximately 100% of the correct value and approximately 50% of the full-scale value.

The use of Gray code instead of standard binary code reduces the maximum error to only one part in $2^n$ of full scale for bit separations of one. The bit separation is the distance in bit positions between the correct one-to-zero transition point and an incorrect transition point. A positive bit separation means that the correct transition point is closer than the incorrrect transition point to the zero end of the array of comparator outputs, while a negative bit separation means that the correct transition point is closer to the full-scale end of the array than the incorrect transition.

Significantly, errors of the same type as discussed above by way of example, i.e. transitions with a bit separation of one, are rendered impossible by the nature of the AND gate logic shown in FIGS. 2a and 2b. For example, consider the comparator outputs that would be required to produce an AND gate output sequence of 001100 in FIG. 2a. To produce the transition 001000 would require inputs of 001111 and to produce the transition 000100 would require inputs of 000111. Since the third comparator output in this string cannot be both 0 and 1 at the same time, the occurrence of two transitions separated by one bit positon is precluded by the AND gates.

Although Gray code is also effective, but to a lesser degree, in reducing errors caused by transitions spaced by greater than one bit position, there is still room for improvement over the use of Gray code in parallel analog-to-digital converters. In accordance with the invention, the conversion from a one-in-$(2^n-1)$ transition code to a binary code is effected by means of a modified Gray code having the characteristics of Gray code in all but its least significant bit position, which alternates in the same manner as standard binary code. A comparison of standard binary code, Gray code and the new code, for decimal values from 0 through 15, is provided in Table 1.

TABLE 1

| Decimal | Binary Code | Gray Code | New Code |
|---------|-------------|-----------|----------|
| 00 | 0000 | 0000 | 0000 |
| 01 | 0001 | 0001 | 0001 |
| 02 | 0010 | 0011 | 0010 |

TABLE 1-continued

| Decimal | Binary Code | Gray Code | New Code |
|---|---|---|---|
| 03 | 0011 | 0010 | 0011 |
| 04 | 0100 | 0110 | 0110 |
| 05 | 0101 | 0111 | 0111 |
| 06 | 0110 | 0101 | 0100 |
| 07 | 0111 | 0100 | 0101 |
| 08 | 1000 | 1100 | 1100 |
| 09 | 1001 | 1101 | 1101 |
| 10 | 1010 | 1111 | 1110 |
| 11 | 1011 | 1110 | 1111 |
| 12 | 1100 | 1010 | 1010 |
| 13 | 1101 | 1011 | 1011 |
| 14 | 1110 | 1001 | 1000 |
| 15 | 1111 | 1000 | 1001 |

Figure 4:
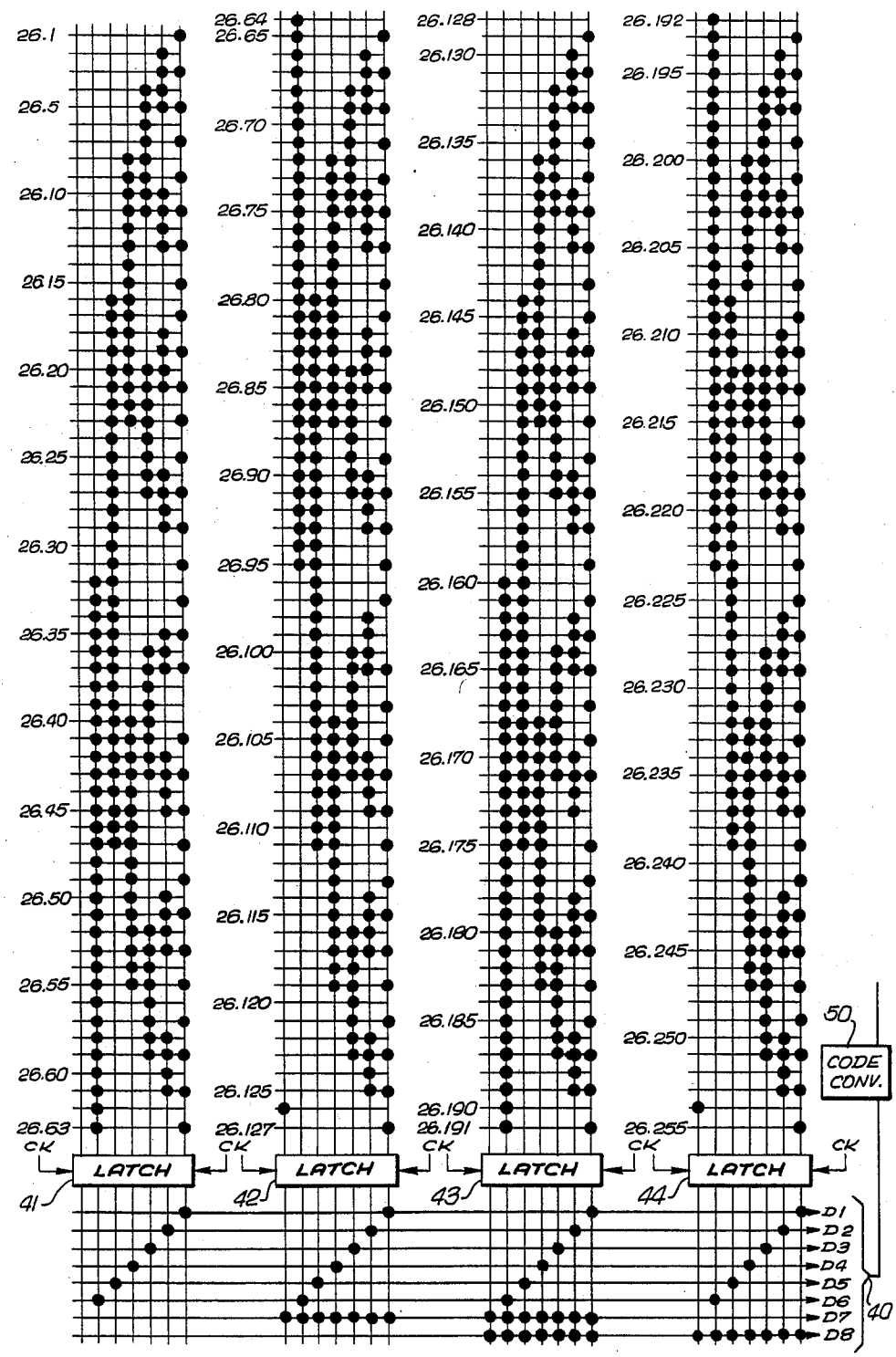
FIG. 4 is a logic diagram similar to FIG. 3, but showing conversion to a modified Gray code in accordance with the invention.

FIG. 4 shows how the binary conversion circuit of FIG. 3 is modified to produce the new output code on lines 40. The input lines 26 from the AND gates 24 have been rearranged for clarity, but the structure still includes the latches 41-44 with seven-bit input lines and output lines 40. The interconnections between the input lines 26 and the latch inputs, and between the latch outputs and the output lines 40 are made selectively to effect encoding in the new modified Gray code rather than in standard binary code.

Since an output in standard binary code will usually be required, the converter may also include means for translating from the modified Gray code on lines 40 to standard binary code. The translating means is indicated at 50 (FIG. 4), and includes conventional components, such as a decoder and a standard binary encoder.

The error arising as a result of ORing together two binary codes corresponding to two detected transitions between ones and zeros, can be computed by comparing the output resulting from the two transitions with output that would have resulted from using the correct transition only. The errors can be easily computed in this fashion for various binary codes, various numbers of bits in the digital output, and various bit separations between correct and incorrect transitions. Tables 2-9 show the errors arising from bit separations of 2 through 5 and −2 through −5, for standard binary code, Gray code and the new modified Gray code, and for binary output codes of from four through ten bits in length.

TABLE 2

| | | Bit separation 2 | | | | | | |
|---|---|---|---|---|---|---|---|---|
| | | No. of bits: | | | | | | |
| | | 4 | 5 | 6 | 7 | 8 | 9 | 10 |
| Peak | Binary | 8 | 16 | 32 | 64 | 128 | 256 | 512 |
| Error | Gray | 3 | 3 | 3 | 3 | 3 | 3 | 3 |
| | New | 2 | 2 | 2 | 2 | 2 | 2 | 2 |
| Mean | Binary | 3.43 | 4.27 | 5.16 | 6.10 | 7.06 | 8.03 | 9.02 |
| Error | Gray | 1.36 | 1.30 | 1.27 | 1.26 | 1.25 | 1.25 | 1.25 |
| | New | 1.14 | 1.07 | 1.03 | 1.02 | 1.01 | 1.00 | 1.00 |
| RMS | Binary | 4.00 | 5.66 | 8.00 | 11.31 | 16.00 | 22.63 | 32.00 |
| Error | Gray | 1.67 | 1.62 | 1.60 | 1.59 | 1.59 | 1.58 | 1.58 |
| | New | 1.51 | 1.46 | 1.44 | 1.43 | 1.42 | 1.42 | 1.42 |

TABLE 3

| | | Bit separation 3 | | | | | | |
|---|---|---|---|---|---|---|---|---|
| | | No. of bits: | | | | | | |
| | | 4 | 5 | 6 | 7 | 8 | 9 | 10 |
| Peak | Binary | 9 | 17 | 33 | 65 | 129 | 257 | 513 |
| Error | Gray | 5 | 5 | 5 | 5 | 5 | 5 | 5 |
| | New | 6 | 6 | 6 | 6 | 6 | 6 | 6 |
| Mean | Binary | 4.85 | 6.03 | 7.33 | 8.70 | 10.11 | 11.57 | 13.04 |

TABLE 3-continued

| | | Bit separation 3 | | | | | | |
|---|---|---|---|---|---|---|---|---|
| | | No. of bits: | | | | | | |
| | | 4 | 5 | 6 | 7 | 8 | 9 | 10 |
| Error | Gray | 2.15 | 2.00 | 1.93 | 1.90 | 1.89 | 1.8 | 1.88 |
| | New | 2.54 | 2.38 | 2.31 | 2.28 | 2.26 | 2.26 | 2.25 |
| RMS | Binary | 5.26 | 7.24 | 10.06 | 14.08 | 19.78 | 27.86 | 39.31 |
| Error | Gray | 2.66 | 2.55 | 2.50 | 2.47 | 2.46 | 2.46 | 2.45 |
| | New | 2.97 | 2.85 | 2.79 | 2.76 | 2.75 | 2.74 | 2.74 |

TABLE 4

| | | Bit separation 4 | | | | | | |
|---|---|---|---|---|---|---|---|---|
| | | No. of bits: | | | | | | |
| | | 4 | 5 | 6 | 7 | 8 | 9 | 10 |
| Peak | Binary | 8 | 16 | 32 | 64 | 128 | 256 | 512 |
| Error | Gray | 7 | 7 | 7 | 7 | 7 | 7 | 7 |
| | New | 6 | 6 | 6 | 6 | 6 | 6 | 6 |
| Mean | Binary | 5.33 | 6.86 | 3.53 | 10.32 | 12.19 | 14.11 | 16.06 |
| Error | Gray | 3.00 | 2.71 | 2.60 | 2.55 | 2.54 | 2.51 | 2.51 |
| | New | 3.00 | 2.71 | 2.60 | 2.55 | 2.54 | 2.51 | 2.51 |
| RMS | Binary | 5.66 | 8.00 | 11.31 | 16.00 | 22.63 | 32.00 | 45.25 |
| Error | Gray | 3.63 | 3.41 | 3.32 | 3.28 | 3.26 | 3.25 | 3.25 |
| | New | 3.56 | 3.34 | 3.25 | 3.20 | 3.18 | 3.17 | 3.17 |

TABLE 5

| | | Bit separation 5 | | | | | | |
|---|---|---|---|---|---|---|---|---|
| | | No. of bits: | | | | | | |
| | | 4 | 5 | 6 | 7 | 8 | 9 | 10 |
| Peak | Binary | 10 | 18 | 34 | 66 | 130 | 258 | 514 |
| Error | Gray | 8 | 9 | 9 | 9 | 9 | 9 | 9 |
| | New | 8 | 10 | 10 | 10 | 10 | 10 | 10 |
| Mean | Binary | 6.9T | 8.74 | 10.78 | 12.98 | 15.28 | 17.66 | 20.09 |
| Error | Gray | 3.82 | 3.41 | 3.22 | 3.14 | 3.10 | 3.08 | 3.07 |
| | New | 4.36 | 3.93 | 3.69 | 3.59 | 3.55 | 3.52 | 3.51 |
| RNS | Binary | 7.15 | 9.70 | 13.31 | 18.46 | 25.78 | 36.17 | 50.91 |
| Error | Gray | 4.44 | 4.21 | 4.06 | 4.00 | 3.97 | 3.95 | 3.94 |
| | New | 4.95 | 4.74 | 4.57 | 4.49 | 4.45 | 4.43 | 4.42 |

TABLE 6

| | | Bit separation - 2 | | | | | | |
|---|---|---|---|---|---|---|---|---|
| | | No. of bits: | | | | | | |
| | | 4 | 5 | 6 | 7 | 8 | 9 | 10 |
| Peak | Binary | 6 | 14 | 30 | 62 | 126 | 524 | 510 |
| Error | Gray | 3 | 3 | 3 | 3 | 3 | 3 | 3 |
| | New | 2 | 2 | 2 | 2 | 2 | 2 | 2 |
| Mean | Binary | 1.25 | 2.13 | 3.06 | 4.03 | 5.02 | 6.01 | 7.00 |
| Error | Gray | 0.94 | 1.09 | 1.17 | 1.21 | 1.23 | 1.24 | 1.25 |
| | New | 0.75 | 0.88 | 0.54 | 0.97 | 0.98 | 0.99 | 1.00 |
| RMS | Binary | 2.35 | 4.21 | 6.77 | 10.29 | 15.16 | 21.95 | 31.46 |
| Error | Gray | 1.30 | 1.45 | 1.52 | 1.55 | 1.56 | 1.57 | 1.58 |
| | New | 1.22 | 1.32 | 1.37 | 1.39 | 1.40 | 1.41 | 1.41 |

TABLE 7

| | | Bit separation - 3 | | | | | | |
|---|---|---|---|---|---|---|---|---|
| | | No. of bits: | | | | | | |
| | | 4 | 5 | 6 | 7 | 8 | 9 | 10 |
| Peak | Binary | 6 | 14 | 30 | 62 | 126 | 254 | 510 |
| Error | Gray | 4 | 5 | 5 | 5 | 5 | 5 | 5 |
| | New | 3 | 5 | 5 | 5 | 5 | 5 | 5 |
| Mean | Binary | 1.50 | 2.75 | 4.13 | 5.56 | 7.03 | 8.52 | 10.01 |
| Error | Gray | 1.19 | 1.53 | 1.70 | 1.79 | 1.83 | 1.85 | 1.86 |
| | New | 1.00 | 1.31 | 1.47 | 1.55 | 1.59 | 1.61 | 1.62 |
| RNS | Binary | 2.47 | 4.78 | 7.95 | 12.30 | 18.31 | 26.67 | 38.36 |
| Error | Gray | 1.82 | 2.16 | 2.31 | 2.38 | 2.41 | 2.43 | 2.44 |
| | New | 1.46 | 1.82 | 1.98 | 2.05 | 2.09 | 2.10 | 2.11 |

TABLE 8

| | | Bit separation - 4 | | | | | | |
|---|---|---|---|---|---|---|---|---|
| | | No. of bits: | | | | | | |
| | | 4 | 5 | 6 | 7 | 8 | 9 | 10 |
| Peak | Binary | 4 | 12 | 28 | 60 | 124 | 252 | 508 |
| Error | Gray | 4 | 7 | 7 | 7 | 7 | 7 | 7 |
| | New | 4 | 6 | 6 | 6 | 6 | 6 | 6 |
| Mean | Binary | 1.00 | 2.50 | 4.25 | 6.13 | 8.06 | 10.03 | 12.02 |
| Error | Gray | 1.25 | 1.88 | 2.19 | 2.34 | 2.42 | 2.46 | 2.48 |
| | New | 1.25 | 1.88 | 2.19 | 2.34 | 2.42 | 2.46 | 2.48 |
| RMS | Binary | 2.00 | 4.69 | 8.43 | 13.55 | 20.59 | 30.33 | 43.91 |
| Error | Gray | 1.97 | 2.68 | 2.97 | 3.11 | 3.18 | 3.21 | 3.22 |
| | New | 1.87 | 2.60 | 2.89 | 3.03 | 3.10 | 3.13 | 3.15 |

TABLE 9

| | | Bit separation - 5 | | | | | | |
|---|---|---|---|---|---|---|---|---|
| | | No. of bits: | | | | | | |
| | | 4 | 5 | 6 | 7 | 8 | 9 | 10 |
| Peak | Binary | 5 | 13 | 29 | 61 | 125 | 253 | 509 |
| Error | Gray | 5 | 8 | 9 | 9 | 9 | 9 | 9 |
| | New | 5 | 7 | 9 | 9 | 9 | 9 | 9 |
| Mean | Binary | 1.31 | 3.16 | 5.33 | 7.66 | 10.08 | 12.54 | 15.02 |
| Error | Gray | 1.31 | 2.16 | 2.61 | 2.87 | 2.98 | 3.01 | 3.03 |
| | New | 1.31 | 2.16 | 2.61 | 2.84 | 2.95 | 3.01 | 3.03 |
| RMS | Binary | 2.19 | 5.16 | 9.33 | 15.06 | 22.94 | 33.84 | 49.03 |
| Error | Gray | 2.17 | 3.13 | 3.56 | 3.75 | 3.85 | 3.89 | 3.91 |
| | New | 2.02 | 2.96 | 3.41 | 3.62 | 3.71 | 3.76 | 3.78 |

For the most common error, with a bit separation of two, whether positive or negative, the performance is significantly improved with use of the encoder of the invention. The peak, mean and root-mean-square errors are all significantly less than with the use of conventional Gray code. As compared with Gray code, improved or equal performance is obtained for all negative bit separations and for even-numbered positive separations of +2 and +4. A slight degradation in performance is observed for positive separations of +3 and +5, and may well also be present for other greater negative odd bit separations. Tables 2 and 6, for bit separations of +2 and −2, apply specifically to the preferred embodiment using two-input AND gates. The three-input AND gate configuration itself provides some degree of protection when the bit separation is two.

It will be appreciated from the foregoing that the present invention represents a significant advance over parallel analog-to-digital converters of the prior art. In particular, the invention provides improved performance over Gray code in the conversion from a 1-in-($2^n-1$) code to a binary code. It will also be appreciated that, although a specific embodiment has been described in detail by way of illustration, various modifications may be made without departing from the spirit and scope of the invention. Accordingly, the invention is not to be limited except as by the appended claims.

I claim:

1. For use in an analog-to-digital converter, encoding means comprising:
   transition detection means for detecting a transition between binary states in an array of input signals, and producing an array of output signals of which only one has a selected binary state, indicative of the position of the detected transition in the array of input signals; and
   binary encoding means coupled to receive the output signals from said transition detection means, for producing a corresponding binary output code having the properties of Gray code in all but its least significant digit and having a least significant digit that alternates in binary state in the manner of standard binary code, whereby errors arising due to multiple indications of transitions in the array of input signals are significantly reduced.

2. Encoding means as set forth in claim 1, wherein:
   said transition detection means includes an array of AND gates, each of which has at least two inputs; and
   each of said AND gates except an end one in said array receives as one input the input signal located at one array position, and receives as a second input an inverted form of the input signal at an adjacent position in the array of input signals;
   whereby each of said AND gates can generate an output of a particular binary state only if the input signal at the same array position of the same binary state and the input signal at the adjacent array position is of the opposite binary state.

3. Encoding means as set forth in claim 1, wherein said binary encoding means includes:
   n output lines for producing an n-bit binary output;
   $2^n-1$ input lines corresponding to the outputs from said transition detection means; and
   an interconnection matrix connecting each of said input lines to a selected combination of said output lines, wherein said interconnection matrix is configured to produce on said output lines the desired binary code having the characteristics of Gray code in its second through nth bit positions and having an alternating characteristic of standard binary code in its first or least significant bit position.

4. A parallel analog-to-digital converter providing an n-bit digital output corresponding to an analog input signal, said converter comprising:
   an array of $2^n-1$ comparators having two analog input terminals and a binary output terminal to indicate which of the signals applied to the input terminals is greater;
   an input circuit for connecting the analog input signal to one input terminal of each of said comparators;
   a reference signal source, providing $2^n-1$ different reference signals for input to the other input terminals of respective ones of said comparators;
   transition detection means, for indicating the position of transition between ones and zeros in said array of comparator outputs;
   encoding means for converting a one-in-($2^n-1$) code from said transition detection means to an n-bit modified Gray code in which the least significant bit alternates between one and zero.

5. A parallel analog-to-digital converter as set forth in claim 4, and further including:
   means for converting the binary signals obtained from said encoding means to standard binary code.

6. A parallel analog-to-digital converter as set forth in claim 4, wherein:
   said transition detection means includes an array of AND gates, each of which has at least two inputs; and
   each of said AND gates except an end one in said array receives as one input the the output from one of said comparators located at one array position, and receives as a second input an inverted form of the output from the one of said comparators located at an adjacent position in said array of comparators;

whereby each of said AND gates can generate an output of a particular binary state only if the comparator output signal at the same array position is of the same binary state and the comparator output signal at the adjacent array position is of the opposite binary state.

7. A parallel analog-to-digital converter as set forth in claim 6, wherein said encoding means includes:
   n output lines for producing an n-bit binary output;
   $2^n-1$ input lines for connection to the outputs from said transition detection means; and
   interconnection means connecting each of said input lines to a selected combination of said output lines, wherein said interconnection means is configured to produce on said output lines the desired binary code having the characteristics of Gray code in its second through nth bit positions and having an alternating characteristic of standard binary code in its first or least significant bit position.

8. A parallel analog-to-digital converter as set forth in claim 7, wherein said interconnection means includes:
   latch means having a plurality of input lines and an equal plurality of output lines;
   means for selectively connecting said input lines from said transition detection means with said latch input lines, to cause an intermediate code to the stored in said latch means; and
   means for selectively connecting said latch output lines with said binary output lines, to convert the intermediate code to the desired binary code.

9. A parallel analog-to-digital converter as set forth in claim 8, and further including means for converting the binary output signals obtained from said encoding means into standard binary code.

10. A parallel analog-to-digital converter as set forth in claim 4, wherein said reference signal source includes:
    a precise source of voltage having a magnitude at least as great as the intended full-scale voltage range of the converter; and
    a voltage divider connected to said source of voltage and having at least $2^n-1$ outputs to provide reference signals at each incremental step in the range of the converter, said voltage divider outputs being connected to an input terminal of respective ones of said comparators.

11. A parallel analog-to-digital converter providing an n-bit digital output corresponding to an analog input signal, said converter comprising:
    an array of $2^n-1$ comparators having two analog input terminals and a binary output terminal to indicate which of the signals applied to the input terminals is greater;
    an input circuit for connecting the analog input signal to one input terminal of each of said comparators;
    a reference signal source, providing $2^n-1$ different reference signals for input to the other input terminal of respective ones of said comparators, said reference signal source including a precise source of voltage having a magnitude at least as great as the intended full-scale voltage range of the converter, and a voltage divider connected to the source of voltage and having at least $2^n-1$ outputs to provide reference signals at each incremental step in the range of the converter, said voltage divider outputs being connected to an input terminal of respective ones of said comparators;
    transition detection means, for indicating the position of transition between ones and zeros in said array of comparator outputs, wherein said transition detection means includes an array of AND gates, each of which has at least two inputs, and each of said AND gates except an end one in said array receives as one input the output from the comparator located at the same array position as the AND gate, and receives as a second input an inverted form of the output from the comparator located at an adjacent position in said array of comparators, whereby each of said AND gates can generate an output of a particular binary state only if the comparator output signal at the same array position is of the same binary state and the comparator output signal at the adjacent array position is of the opposite binary state; and
    encoding means for converting a one-in-$(2^n-1)$ code from said transition detection means to an n-bit modified Gray code in which the least significant bit alternates between one and zero, wherein said encoding means includes n output lines for producing an n-bit binary output, $2^n-1$ input lines corresponding to the outputs from said transition detection means, and interconnection means connecting each of said input lines to a selected combination of said output lines, wherein said interconnection means is configured to produce on said output lines the desired binary code having the characteristics of Gray code in its second through nth bit positions and having an alternating characteristic of standard binary code in its first or least significant bit position.

12. A parallel analog-to-digital converter as set forth in claim 11, and further including means for converting the binary signals obtained from said encoding means into standard binary code.

13. A parallel analog-to-digital converter as set forth in claim 11, wherein said interconnection means includes:
    latch means having a plurality of input lines and an equal plurality of output lines;
    means for selectively connecting said input lines from said transition detection means with said latch input lines, to cause an intermediate code to be stored in said latch means; and
    means for selectively connecting said latch output lines with said n binary output lines, to convert the intermediate code to the desired binary code.

* * * * *